United States Patent
Mizobuchi

(10) Patent No.: US 6,658,575 B1
(45) Date of Patent: Dec. 2, 2003

(54) VOICE RECORDING/REPRODUCING APPARATUS WHICH ENTERS A STANDBY MODE WHILE IN A COMMUNICATION MODE WITH AN EXTERNAL DEVICE

(75) Inventor: Koji Mizobuchi, Sagamihari (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/525,166

(22) Filed: Mar. 14, 2000

(30) Foreign Application Priority Data

Mar. 17, 1999 (JP) .......................................... 11-072503
Mar. 17, 1999 (JP) .......................................... 11-072504

(51) Int. Cl.<sup>7</sup> .............................. G06F 1/26; G06F 1/32
(52) U.S. Cl. ..................................................... 713/300
(58) Field of Search ................................ 713/300, 310; 360/60

(56) References Cited

U.S. PATENT DOCUMENTS

| | | | | |
|---|---|---|---|---|
| 5,500,830 A | * | 3/1996 | Okabayashi | 365/230.08 |
| 5,781,769 A | * | 7/1998 | Weber | 713/502 |
| 5,809,223 A | * | 9/1998 | Lee et al. | 714/4 |
| 5,815,205 A | * | 9/1998 | Hashimoto et al. | 348/373 |
| 5,822,608 A | * | 10/1998 | Dieffenderfer et al. | 712/20 |
| 5,929,771 A | * | 7/1999 | Gaskill | 340/7.54 |
| 6,016,548 A | * | 1/2000 | Nakamura et al. | 713/323 |
| 6,098,174 A | * | 8/2000 | Baron et al. | 713/300 |
| 6,317,827 B1 | * | 11/2001 | Cooper | 713/2 |

FOREIGN PATENT DOCUMENTS

| | | | | |
|---|---|---|---|---|
| JP | 10063473 A | * | 3/1998 | ............. G06F/3/16 |
| JP | 10-91540 A | * | 4/1998 | |

* cited by examiner

*Primary Examiner*—Thomas Lee
(74) *Attorney, Agent, or Firm*—Frishauf, Holtz, Goodman & Chick, P.C.

(57) ABSTRACT

A voice recording/reproducing apparatus incorporates a storage portion, a communication portion and a control unit. The storage portion incorporates a voice-data region and an index-information region. The communication portion establishes communication with an external communication apparatus. The control unit controls writing of voice data converted into digital signals and index information concerning voice data on the voice-data region and the index-information region of the storage portion and reading of voice data stored in the voice-data region in accordance with index information concerning voice data stored in the index-information region of the storage portion and interrupting a communication mode under a predetermined condition of a communication operation concerning a process for transmitting voice data stored in the voice-data region of the storage portion to the external communication apparatus during the communication mode in which the communication portion is caused to establish communication with the external communication apparatus so that a power source of the voice recording/reproducing apparatus is limited to small power consumption to put the voice recording/reproducing apparatus into a standby mode.

16 Claims, 4 Drawing Sheets

VOICE RECORDING/REPRODUCING APPARATUS WHICH ENTERS A STANDBY MODE WHILE IN A COMMUNICATION MODE WITH AN EXTERNAL DEVICE

CROSS-REFERENCE TO RELATED APPLICATIONS

This application is based upon and claims the benefit of priority from the prior Japanese Patent Applications No. 11-072503, filed Mar. 17, 1999; and No. 11-072504, filed Mar. 17, 1999, the entire contents of which are incorporated herein by reference.

BACKGROUND OF THE INVENTION

The present invention relates to a voice recording/reproducing apparatus and a control method therefor, and more particularly to a voice recording/reproducing apparatus having a communication function and a control method therefor.

In recent years, a portable voice recording/reproducing apparatus has been put into practical use, the apparatus being an apparatus of a type having a communication function and structured to convert a voice signal into digital data. Then, digital data is stored in a flush memory which is a reloadable storage medium. Voice data stored in the flush memory is converted into analog data so that reproduction of voice data is permitted.

The portable voice recording/reproducing apparatus of the foregoing type, and more particularly a voice recording/reproducing apparatus which is operated by a battery sometimes encounters malfunction or shortening of the lifetime of the battery. The foregoing problems are caused from an unintentional operation of the switch in a communication mode or excessively long waiting (non-communication state) during the communication mode.

When the communication is established between, for example, a personal computer (PC) and the voice recording/reproducing apparatus, the voice recording/reproducing apparatus is usually brought to a slave state. If a command waiting state is continued for a long time such that the power consumption of the voice recording/reproducing apparatus is not reduced, there is apprehension that communication cannot be established simultaneously with start of the communication (a command transmitted from the PC is received) owing to reduction in the voltage of the battery.

When the voice recording/reproducing apparatus is brought to the communication mode in a state where input of each operation switch is permitted and any one of the operation switch is depressed during the communication, a sequence operation which does not concern the communication is undesirably started. In the foregoing case, there is apprehension that the communication is interrupted.

When the communication mode of the voice recording/reproducing apparatus is given priority as compared with other sequence operations, the recording operation or the reproducing operation is interrupted. Therefore, an operator feels a sense of disharmony. What is worse, the operability of the voice recording/reproducing apparatus deteriorates excessively.

If a battery of the voice recording/reproducing apparatus arranged to be operated with the battery is unintentionally separated (removed), normal reproduction of recorded voice data is usually inhibited.

Therefore, an invention has been disclosed in Jpn. Pat. Appln. KOKAI Publication No. 10-91540, in which the recording sequence which is being executed is quickly completed if the battery cover is opened.

That is, the invention disclosed in Jpn. Pat. Appln. KOKAI Publication No. 10-91540 has a structure that at least voice data and administration information are written on a semiconductor memory before the battery is removed and the control of the sequence is brought to out of control. Thus, reproduction of recorded voice data can be performed.

If the battery of the voice recording/reproducing apparatus of a type having the communication function is unintentionally separated (removed) during loading of voice data on a storage medium of a PC, normal reproduction of transmitted voice data is inhibited similar to the foregoing problem occurring during the recording operation.

Therefore, all of voice data items transmitted before the interruption of the communication must be abandoned in a usual case after the separation of the battery has been recovered. Hence it follows that the operability deteriorates and the operator is subjected to a great stress and feels uneasy.

BRIEF SUMMARY OF THE INVENTION

An object of the present invention is to provide a voice recording/reproducing apparatus arranged to interrupt the communication mode under certain conditions to put the voice recording/reproducing apparatus into a standby mode in which power consumption is reduced to facilitate handling and prevent an operation mistake and to normally reproduce voice data stored before interruption of the communication mode and a control method therefor.

To achieve the foregoing object, according to one aspect of the present invention, there is provided a voice recording/reproducing apparatus comprising:

storage means incorporating a voice-data region and an index-information region;

communication means for establishing the communication with an external communication apparatus; and control means for controlling writing of voice data converted into digital signals and index information concerning voice data on the voice-data region and the index-information region of the storage means and reading of voice data stored in the voice-data region in accordance with index information concerning voice data stored in the index-information region of the storage means and interrupting a communication mode under a predetermined condition of a communication operation concerning a process for transmitting voice data stored in the voice-data region of the storage means to an external communication apparatus during the communication mode in which the communication means is caused to establish communication with the external communication apparatus so that a power source of the voice recording/reproducing apparatus is limited to small power consumption to put the voice recording/reproducing apparatus into a standby mode.

To achieve another aspect of the invention, there is provided a method of controlling a voice recording/reproducing apparatus incorporating storage means having a voice-data region and an index-information region; and communication means for establishing communication with an external communication apparatus, the method of controlling a voice recording/reproducing apparatus comprising the steps of:

controlling writing of voice data converted into a digital signal and index information concerning voice data on the voice-data region and the index-information region of the storage means;

controlling reading of voice data stored in the voice-data region of the storage means in accordance with index information concerning voice data stored in the index-information region of the storage means; and interrupting a communication mode under a predetermined condition of a communication operation concerning a process for transmitting voice data stored in the voice-data region of the storage means to the external communication apparatus during the communication mode in which the communication means is caused to establish communication with the external communication apparatus so that a power source of the voice recording/reproducing apparatus is limited to small power consumption to put the voice recording/reproducing apparatus into a standby mode.

To achieve the foregoing object, according to another aspect of the invention, there is provided a voice recording/reproducing apparatus comprising:

an operation portion incorporating a plurality of switches for bringing the voice recording/reproducing apparatus to a predetermined operation state including a voice recording/reproducing mode;

a storage portion incorporating a voice-data region and an index-information region;

a communication portion for establishing communication with an external communication apparatus;

a first control unit arranged to correspond to the voice recording/reproducing mode realized by the operation portion so as to control writing of voice data converted into digital signals and index information concerning voice data on the voice-data region and the index-information region of the storage means and reading of voice data stored in the voice-data region in accordance with index information concerning voice data stored in the index-information region of the storage means;

a determining portion for determining whether or not a communication operation concerning a process for transmitting voice data stored in the voice-data region of the storage portion to the external communication apparatus satisfies a predetermined condition during the communication mode in which the communication portion establishes communication with the external communication apparatus; and a second control unit for interrupting the communication mode when the determining portion has determined that the communication operation satisfies the predetermined condition so as to limit a power source of the voice recording/reproducing apparatus to small power consumption to put the voice recording/reproducing apparatus into a standby mode.

To achieve the foregoing object, according to another aspect of the invention, there is provided a method of controlling a voice recording/reproducing apparatus incorporating an operation portion having a plurality of switches for realizing a predetermined operation state including a voice recording/reproducing mode, a storage portion incorporating a voice-data region and an index-information region and a communication portion for establishing communication with an external communication apparatus, the method of controlling a voice recording/reproducing apparatus comprising the steps of:

corresponding to the voice recording/reproducing mode realized by the operation portion so as to control writing of voice data converted into digital signals and index information concerning voice data on the voice-data region and the index-information region of the storage means and control reading of voice data stored in the voice-data region in accordance with index information concerning voice data stored in the index-information region of the storage means;

determining whether or not a communication operation concerning a process for transmitting voice data stored in the voice-data region of the storage portion to the external communication apparatus satisfies a predetermined condition during the communication mode in which the communication portion establishes communication with the external communication apparatus; and interrupting the communication mode when a determination has been made that the communication operation satisfies the predetermined condition so as to limit a power source of the voice recording/reproducing apparatus to small power consumption to put the voice recording/reproducing apparatus into a standby mode.

Note that the predetermined condition includes a state where a predetermined period of time has elapsed without any communication operation in a communication mode.

The predetermined condition includes a state where a cover of a battery accommodating portion for accommodating a battery which is the power source of the voice recording/reproducing apparatus is opened.

Additional objects and advantages of the invention will be set forth in the description which follows, and in part will be obvious from the description or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of present invention and, together with the general description given above and the detailed description of the preferred embodiments given below, serve to explain the principles of the present invention.

DETAILED DESCRIPTION OF THE INVENTION

Figure 1:
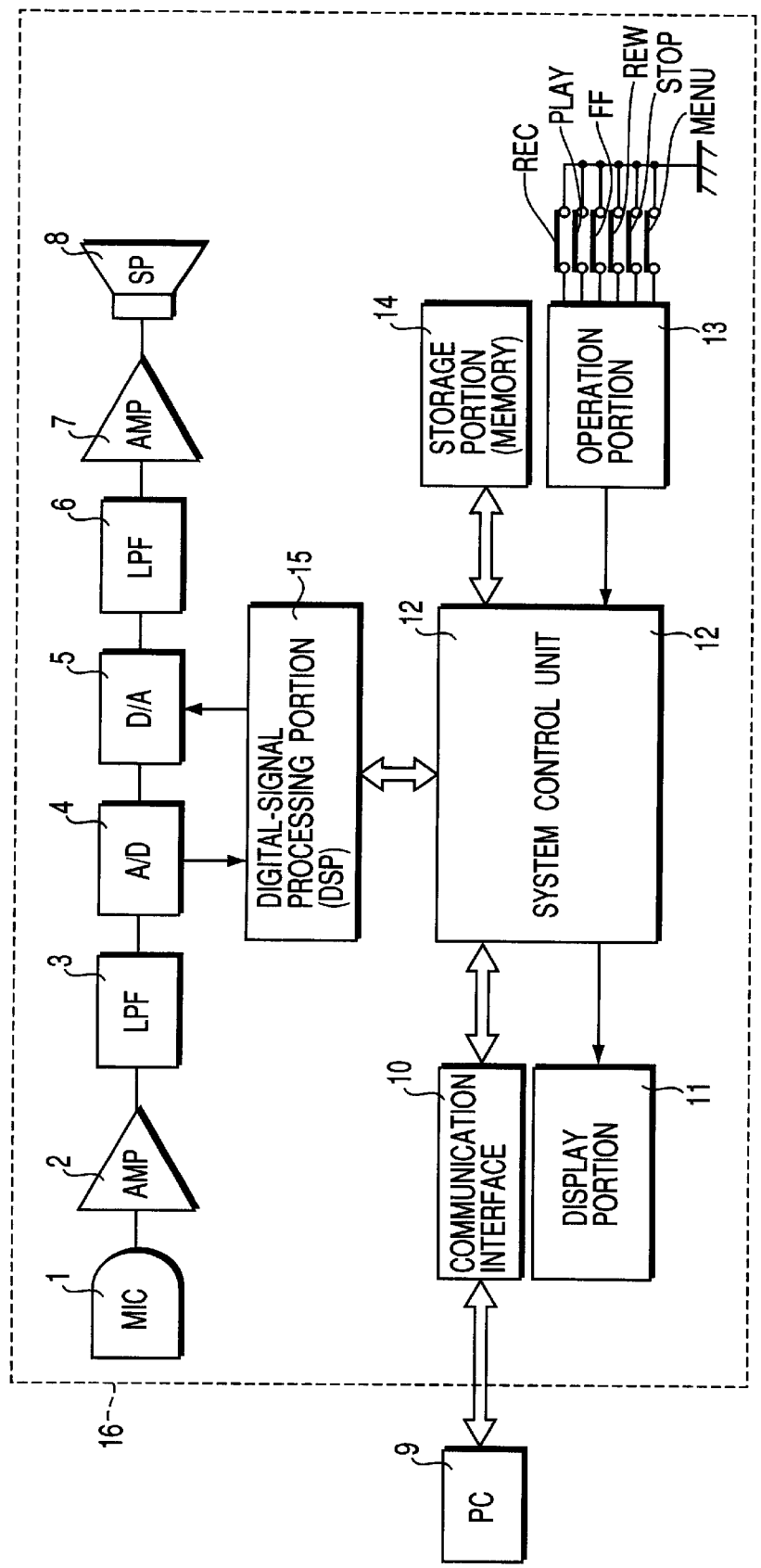
FIG. 1 is a block diagram showing the structure of an IC recorder according to a first embodiment of the present invention.

Reference will now be made in detail to the presently preferred embodiments of the invention as illustrated in the accompanying drawings, in which like reference numerals designate like or corresponding parts.

Referring to the drawings, embodiments of the present invention will now be described.

First Embodiment

FIG. 1 is a block diagram showing the structure of a voice recording/reproducing apparatus (hereinafter called an "IC recorder") according to a first embodiment of the present invention.

The IC recorder according to this embodiment incorporates a microphone 1 for converting voice into an electric signal.

A voice output from the microphone 1 is amplified by a microphone amplifier (AMP) 2 connected to the microphone 1.

The voice signal amplified by the microphone amplifier 2 is supplied to a low-pass filter (LPF) 3 to cut unnecessary frequency bands, and then the voice signal is input to an A/D converter (A/D) 4.

The voice signal converted into a digital signal by the A/D converter 4 is input to a digital-signal processing portion (DSP) 15.

The digital-signal processing portion 15 is controlled by a system control unit 12 during a recording operation to compress (encode) the voice signal converted into the digital signal by the A/D converter 4 into data formed into a predetermined format in frame units.

Data encoded by the digital-signal processing portion 15 is extracted into a buffer memory (not shown) included in the system control unit 12 so as to temporarily be stored as voice data.

During a reproducing operation, the digital-signal processing portion 15 is controlled by the system control unit 12. Thus, the digital-signal processing portion 15 performs an operation for, in frame units, expanding (decoding) voice data temporarily stored in the buffer memory (not shown) included in the system control unit 12.

The digital signal decoded by the digital-signal processing portion 15 is output to a D/A converter 5.

The voice data converted into an analog signal by the D/A converter 5 is supplied to a low-pass filter (LPF) 6 so that unnecessary frequency bands of the voice signal are cut. Then, the voice signal is output to a power amplifier (AMP) 7.

A voice signal amplified by the power amplifier (AMP) 7 is output from a speaker unit 8 as voice.

The system control unit 12 comprises a CPU.

In addition to the digital-signal processing portion 15, a storage portion (a memory) 14, an operation portion 13, a display portion 11 and a communication interface 10 are connected to the system control unit 12.

The storage portion 14 incorporates at least a voice-data region and an index-information region.

The storage portion 14 is constituted by a nonvolatile semiconductor memory, for example, a flush memory, or a removal recording medium, for example, a card memory or a disc memory. When a recording operation is performed, voice data encoded by the digital-signal processing portion 15 is stored in the voice-data region through the buffer memory (not shown) of the system control unit 12.

At this time, the storage portion 14 stores index information concerning voice data in the index-information region.

The operation portion 13 incorporates a variety of functional switches including a recording switch (REC), a play switch (PLAY), a stop switch (STOP), a fast-forward movement switch (FF), a fast rewinding switch (REW) and a menu switch (MENU).

When any one of the foregoing switches of the operation portion 13 has been operated, the display portion 11 displays an operation mode when a predetermined sequence control has been started or an operation state realized after the start of the sequence control.

When, for example, the recording switch (REC) of the operation portion 13 has been depressed, the display portion 11 displays an elapsed recording time, remaining recording period time, the file number and so forth.

When the menu switch (MENU) of the operation portion 13 has been depressed, the display portion 11 performs display concerning the function selection including the sensitivity (high/low) of the microphone, the recording mode (standard/long) and alarm (on/off).

When the system control unit 12 has a clock function, the display portion 11 display present time.

The communication interface 10 is connected to the system control unit 12 and an external communication apparatus, for example, a PC (personal computer) 9.

As described above, the IC recorder 16 is brought to a slave state at a moment of time at which the IC recorder 16 has been connected to the PC 9.

Thus, the PC 9 connected to the communication interface 10 of the IC recorder 16 is able to read data in the storage portion 14 and write data in the storage portion 14 through the system control unit 12.

The PC 9 is able to convert voice input to the microphone 1 of the IC recorder 16 into voice data by performing the foregoing compressing process to directly store voice data in a storage medium (not shown) in the PC 9 through the system control unit 12. Moreover, the PC 9 is able to output voice data stored in the storage medium (not shown) in the PC 9 through the speaker unit 8 as voice by performing the foregoing expanding process.

The operation of the IC recorder according to the first embodiment of the present invention will now be described with reference to FIGS. 3 and 4.

Figure 3:
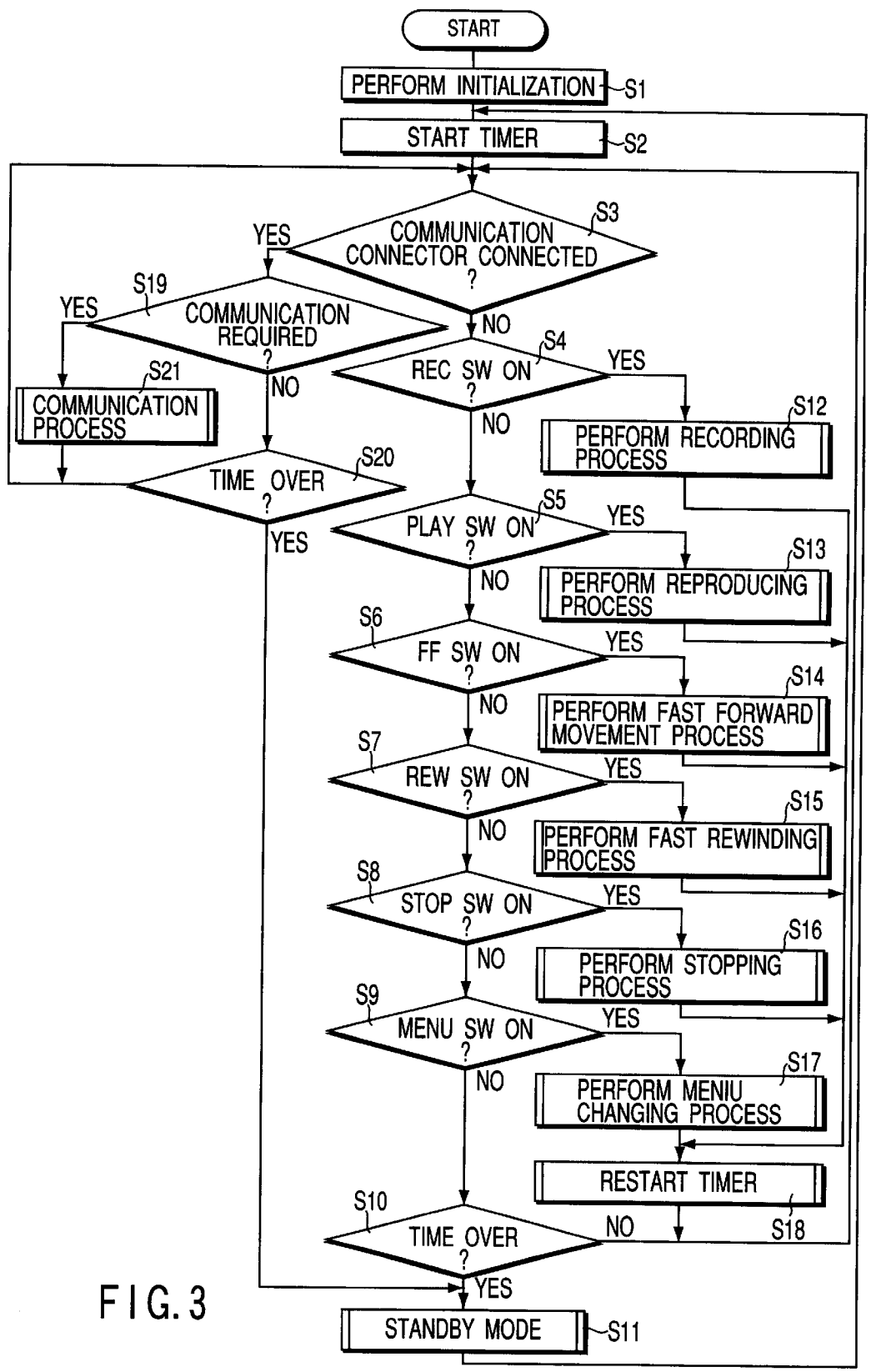
FIG. 3 is a flowchart showing a main operation of the IC recorder according to the first embodiment of the present invention.

FIG. 3 is a flowchart showing a main operation of the IC recorder according to the first embodiment of the present invention.

Figure 4:
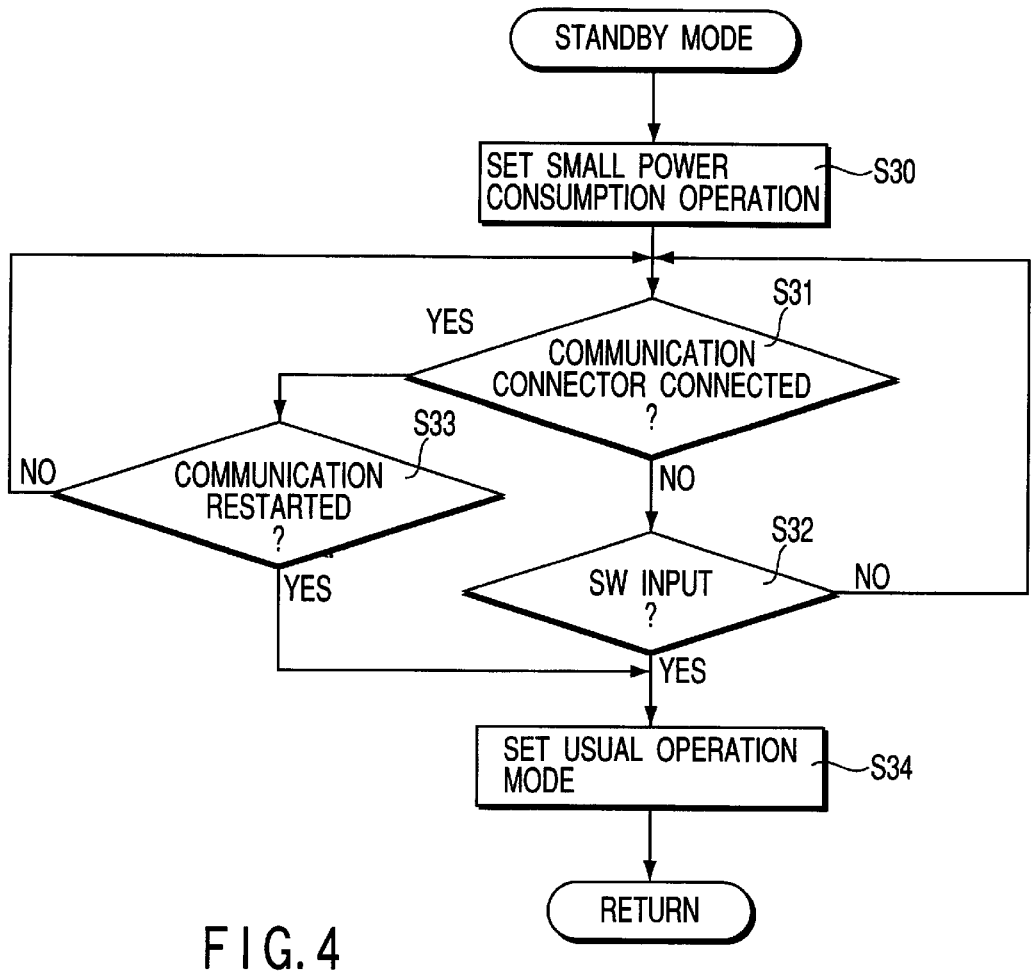
FIG. 4 is a flowchart showing a standby mode of the IC recorder according to the first embodiment of the present invention.

FIG. 4 is a flowchart showing a standby mode of the IC recorder according to the first embodiment of the present invention.

As shown in FIG. 3, when electric power has been supplied to the IC recorder according to the first embodiment of the present invention, the system control unit 12 performs a predetermined initialization (step S1) and starts the timer (step S2).

The timer measures time taken for the IC recorder in a usual operation mode to be put into the standby mode (a small power consumption mode) after a predetermined time has elapsed.

The system control unit 12 determines whether or not a communication connector has been connected (step S3). When the connection has not been established, a system control unit 12 puts the IC recorder into a usual operation mode in which the IC recorder is operated solely.

Note that the establishment of the communication connector can easily be detected by detecting the voltage level (H: high level or L: low level) of a predetermined signal pin (not shown) of the connector.

When the usual operation mode in which the IC recorder is operated solely has been started, the system control unit 12 performs a switch detecting operation in steps S4 to S9 to sequentially detect whether or not each of the recording switch (REC), the play switch (PLAY), the fast-forward movement switch (FF), the fast rewinding switch (REW), the stop switch (STOP) and the menu switch (MENU) has been switched on.

When the recording switch has been switched on in step S4, the system control unit 12 executes a sub-routine (step S12) of the recording process.

When the reproducing switch has been switched on in step S5, the system control unit 12 executes a sub-routine (step S13) of the reproducing process.

When the fast forward movement switch has been switched on in step S6, the system control unit 12 executes a sub-routine (step S14) of the fast forward movement process.

When the fast rewinding switch has been switched on in step S7, the system control unit 12 executes a sub-routine (step S15) of the fast rewinding process.

When the stop switch has been switched on in step S8, the system control unit 12 executes a sub-routine (step S16) of the stopping process.

When the menu switch has been switched on in step S9, the system control unit 12 executes a sub-routine (step S17) of the menu changing process.

After the system control unit 12 has executed any one of the sub-routines (steps S12 to S17), the system control unit 12 restarts the timer (step S18) and returns to a main loop.

The recording process, the reproducing process, the fast-forward movement process, the fast rewinding process, the stopping process and the menu changing process are performed by known techniques. Since the foregoing processes do not concern the contents of the present invention, description of the processes is omitted.

When a state where all of the switches are switched off has been detected in steps S4 to S9, the system control unit 12, in the main loop, repeatedly makes a comparison (step S10) between the time measured by the timer and a predetermined time. When the measured time has been longer than the predetermined time, the system control unit 12 starts a sub-routine of the standby mode (step S11).

When the communication connector has been connected, the system control unit 12 makes the determination of the connection of the communication connector (step S3) such that the connection has been established. Thus, the operation mode of the IC recorder is automatically switched from the usual operation mode in which the IC recorder is solely operated to the communication mode.

When a command has been input from the PC 9 (step S19), the system control unit 12 performs a communication process corresponding to the command (step S21). Then, a state in which input of a command is realized.

The PC 9 outputs a command, for example, a file transfer command for requiring the PC 9 to transfer a file, a file reproducing command for requiring the IC recorder to reproduce a file and a command for requiring the IC recorder to display the number of records.

In a state where input of a command is waited for, the comparison (step S20) between the time measured by the timer and the predetermined time is repeatedly performed. When the measured time has been made to be longer than the predetermined time, the sub-routine of the standby mode is started (step S11).

When the standby mode has been started as shown in FIG. 4, the IC recorder 16 shown in FIG. 1 is brought to a state where the microphone 1 is operated with a small power consumption (step S30).

Specifically, supply of electric power to each of the microphone amplifier (AMP) 2, the low-pass filter (LPF) 3, the A/D converter (A/D) 4, the digital-signal processing portion (DSP) 15, the D/A converter 5, the low-pass filter (LPF) 6, the power amplifier (AMP) 7, the display portion 11, the storage portion 14 and the communication interface 10 is interrupted. As an alternative to this, the system control unit 12 outputs a non-selection signal to a chip enable terminal provided for an IC (not shown) which constitutes each block. Thus, the standby mode in which the power consumption is reduced is started.

At this time, the CPU of the system control unit 12 switches its operation clock to a low-speed clock with which the power consumption is maximally reduced so that the standby mode in which the power consumption is reduced is started.

In some cases, the CPU of the system control unit 12 may be arranged such that the operation clock is changed from the main clock (for example, 9.28 MHz) to a sub-clock (for example, 32.768 kHz). In this case, the main clock is completely suspended until the communication is restarted or input of a switch is detected.

When a communication line is previously connected to an interruption board of the CPU of the system control unit 12 if the main clock is changed to the sub-clock, the operation clock can again be changed to the main clock by detecting change in the input of a signal (from "H" to "L" or from "L" to "H").

When a determination of the connection of the communication connector (step S31) is made that the communication connector has been connected, restart of the communication is waited for (step S33). The foregoing state is maintained until a command of some kind is input from the PC 9.

When the communication is restarted, a usual operation mode (a state restarted from the low power consumption operation) is started (step S34). Then, the operation is returned to the main loop.

When the connection of the communication connector is suspended in the loop for a state where the communication connector is connected, input of a switch operation is waited for (step S32). The foregoing state is maintained until an operation switch of some kind in the operation portion 13 is switched on.

When any one of the operation switches in the operation portion 13 has been switched on, the usual operation mode is started (step S34) similarly to the restart of the communication. Then, the operation is returned to the main loop.

As a matter of course, the foregoing operation is similar to the operation which is performed when the operation in the main loop has been changed to the standby mode such that suspension of the connection of the communication connector is maintained.

As described above, the IC recorder according to the first embodiment of the present invention is able to prevent suspension of the communication mode even if the switch is unintentionally operated during the communication mode or the standby mode for the communication mode. Therefore, the operability can significantly be improved.

Thus, according to the first embodiment of the present invention, the voice recording/reproducing apparatus which can easily be operated and which is free from operation mistake and a control method therefor can be provided.

Second Embodiment

A voice recording/reproducing apparatus (hereinafter called an "IC recorder") according to a second embodiment of the present invention will now be described.

The block structure of the IC recorder according to the second embodiment of the present invention is similar to that of the IC recorder according to the first embodiment shown in FIG. 1.

The main operation of the IC recorder according to the second embodiment of the present invention is similar to that of the IC recorder according to the first embodiment shown in FIG. 3.

The IC recorder according to the second embodiment of the present invention is different from the IC recorder according to the first embodiment in that an interruption process is performed when a battery cover has been opened during communication which is different from the standby mode of the IC recorder according to the first embodiment.

Therefore, the interruption process which is performed when the battery cover has been opened during communication will now be described.

Figure 5:
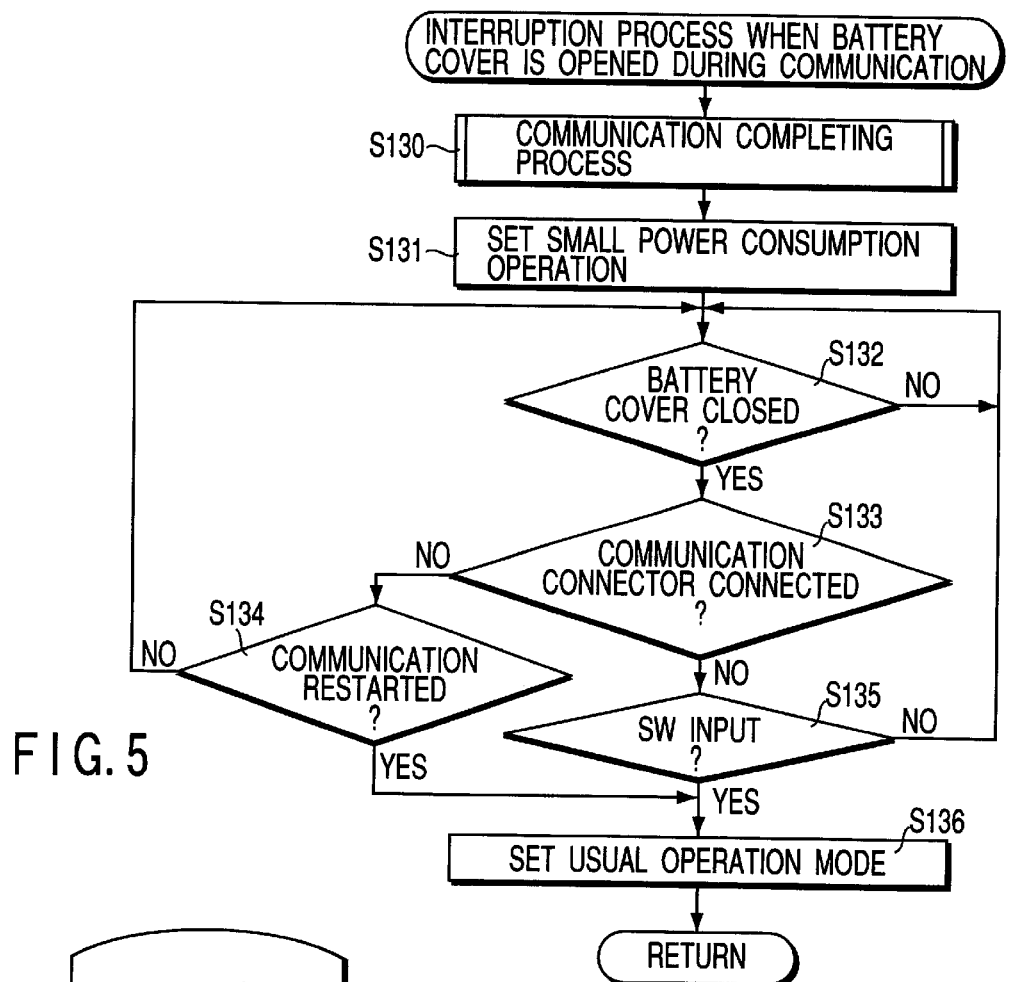
FIG. 5 is a flowchart showing an interruption process which is performed during a state where a battery cover has been opened during communication of the IC recorder according to the second embodiment of the present invention.

FIG. 5 is a flowchart showing the interruption process of the IC recorder according to the second embodiment of the present invention which is performed when the battery cover has been opened during communication.

If the battery cover of the IC recorder according to the second embodiment of the present invention is opened during communication, the system control unit 12 immediately performs a communication completing process (step S130). Thus, the IC recorder 16 is put into the standby mode in which the power consumption is reduced similarly to the first embodiment (step S131).

Note that detection of opening of the battery cover will be described later with reference to FIG. 6.

The system control unit 12 is put into the standby mode in which the power consumption is reduced until the battery cover is closed (step S132).

When the battery cover has completely been closed and a determination is made (step S133) that the communication connector has been connected, the system control unit 12 is put into a mode in which restart of the communication is waited for (step S134). The foregoing state is maintained until a command of some kind is supplied from the PC 9.

The system control unit 12 starts the usual operation mode (a state restored from the mode in which the power consumption is reduced) (step S136) when the communication is restarted. Then, the operation of the system control unit 12 is returned to the main loop.

If the connection of the communication connector is suspended in the loop for a switch in which the communication connector has been connected, the system control unit 12 is put to a state in which input from any switch in the operation portion 13 (step S135) is waited for. The foregoing state in which input from a switch is waited for is maintained until any one of the operation switches is switched on.

When any one of the operation switches in the operation portion 13 has been switched on, the system control unit 12 starts the usual operation mode (step S136) similarly to the state where the communication is restarted. The operation of the system control unit 12 is returned to the main loop.

Figure 2:
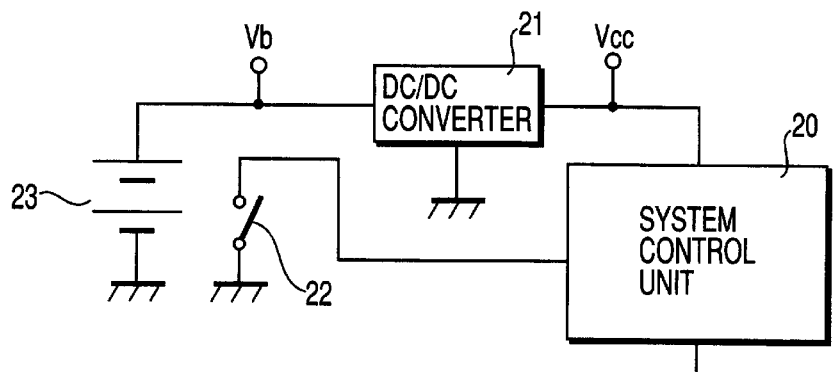
FIG. 2 is a diagram showing the structure of a power source of an IC recorder according to a second embodiment of the present invention and omitted from illustration in FIG. 1 which is a block diagram.

FIG. 2 shows the power source portion of the IC recorder according to the second embodiment of the present invention which is omitted from FIG. 1 which is the block diagram.

Referring to FIG. 2, supply of electric power to a system control unit 20 (corresponding to the system control unit 12 shown in FIG. 1) is realized by a DC/DC converter 21 which raises the output voltage from a battery 23 to a predetermined voltage level.

Output voltage from a terminal Vb is supplied to analog power sources, such as the microphone amplifier (AMP) 2 and the power amplifier (AMP) 7 shown in FIG. 1.

Output voltage from a terminal Vcc is supplied to power sources of the digital-signal processing portion (DSP) 15, the storage portion 14 and the communication interface 10 shown in FIG. 1.

A switch 22 arranged to be switched on/off in synchronization with opening/closing of the battery cover is input to an interruption port of the system control unit 20 because the switch 22 must detect opening of the battery cover with priority as compared with other operations.

Note that the standard power source of the IC recorder of a type according to the second embodiment of the present invention is usually a dry cell because easy change is permitted and the dry cell is easily available.

Figure 6:
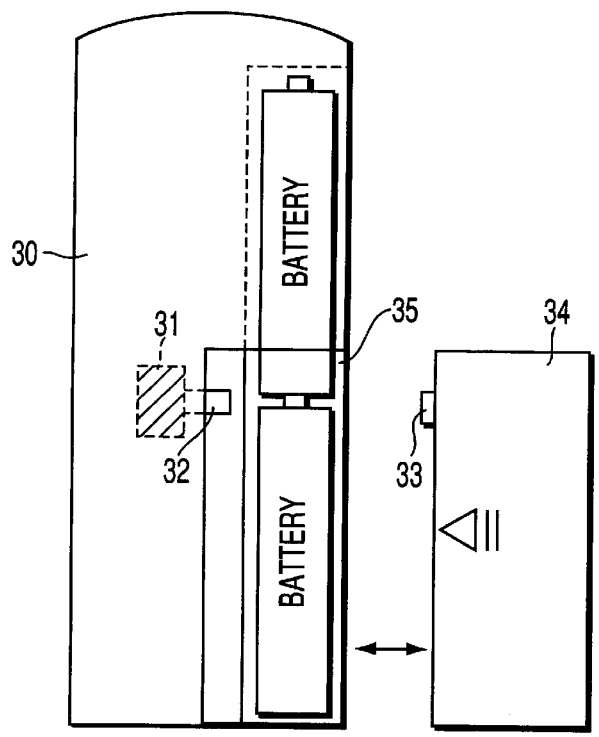
FIG. 6 is a diagram showing the power source of the IC recorder according to the second embodiment of the present invention.

Therefore, as shown in FIG. 6, a battery accommodating chamber 35 having a space which permits series accommodation of, for example, two AAA batteries is formed into a recess shape provided for the reverse side of a case 30 or the like.

To prevent easy falling of the battery accommodated in the battery accommodating chamber 35 owing to a shock caused from vibrations or falling during use, a battery cover 34 which completely covers the recess, a portion of which is exposed, is provided.

An engaging recess (not shown) is provided for the battery accommodating chamber 35 of the case 30 which is engaged to the battery cover 34.

Also the battery cover 34 has an engaging member which is engaged to the engaging recess of the battery accommodating chamber 35.

When the battery cover 34 is slid in the lateral direction to cover the recess of the battery accommodating chamber 35 provided for the case 30 which is partially exposed, the engaging member of the battery cover 34 is engaged to the engaging recess of the battery accommodating chamber 35 provided for the case 30.

Moreover, the engaging portion of the battery cover 34 has a projection 33 so as to inwards push a projection 32 forming a switch 31 disposed in the case 30 when the battery cover 34 has completely been engaged to the battery accommodating chamber 35 provided for the case 30.

When the battery cover 34 has been slid and opened, the state of pressing realized by the projection 33 is suspended.

That is, the switch 31 is switched on/off in synchronization with opening/closing of the battery cover 34.

An assumption is made that the switch 22 shown in FIG. 2 is switched on when the battery cover is opened and switched off when the battery cover is closed. If an operator unintentionally drops the IC recorder during the communication mode and, therefore, the battery cover is removed, the system control unit 20 immediately detects a fact that the switch 22 has been switched on. Thus, the system control unit 20 performs a communication completing process.

The foregoing communication completing process is a process for writing administration information indicating a storage region in the storage medium of the PC 9 in which voice data transmitted from the storage medium of the IC recorder to the storage medium of the PC 9 is stored until interruption of the communication.

Thus, the PC 9 is able to reproduce voice data transmitted until the interruption of the communication in accordance with administration information.

As described above, the IC recorder according to the second embodiment of the present invention is able to normally restore data read or written previously if the IC recorder is dropped or the battery is unintentionally separated.

Therefore, according to the second embodiment, data read or written previously can normally be restored if the IC recorder is dropped or the battery is unintentionally separated. Therefore, the voice recording/reproducing apparatus capable of significantly improving the operability and the control method therefor can be provided.

Additional advantages and modifications will readily occur to those skilled in the art. Therefore, the invention in its broader aspect is not limited to the specific details and representative embodiments shown and described herein. Accordingly, various modifications may be made without departing from the spirit or scope of the general inventive concept as defined by the appended claims and their equivalents.

What is claimed is:

1. A voice recording/reproducing apparatus comprising:
   a storage device having a voice-data region and an index-information region;
   communication means for establishing communication with an external communication apparatus; and
   control means for controlling writing of voice data converted into digital signals and index information relating to the voice data on the voice-data region and the index-information region of the storage device, controlling reading of the voice data stored in the voice-data region in accordance with the index information stored in the index-information region of the storage device, and limiting a power consumption of the recording/reproducing apparatus by shifting the voice recording/reproducing apparatus into a standby mode after a communication mode has been interrupted if a communication operation meets a predetermined condition with respect to a process for transmitting the voice data stored in the voice-data region of the storage device to the external communication apparatus during the communication mode in which the communication means is capable of communicating with the external communication apparatus.

2. A voice recording/reproducing apparatus according to claim 1, wherein the predetermined condition is a condition in which communication with the external communication apparatus has been established, and a predetermined time period has elapsed without any communication operation.

3. A voice recording/reproducing apparatus according to claim 2, wherein the control means inhibits execution of detection of switch input and a predetermined sequence concerning the detection during the communication mode and the standby mode.

4. A voice recording/reproducing apparatus according to claim 2, wherein the control means inhibits shift to the communication mode when a predetermined sequence is being performed which includes control of writing of the voice data and the index information and control of reading of the voice data.

5. A voice recording/reproducing apparatus according to claim 1, further comprising cover-opening detection means for detecting opening of a cover of a battery accommodating portion for accommodating a battery, wherein the predetermined condition is a condition in which a signal indicating opening of the cover has been supplied from the cover-opening detection means, and wherein the control means shifts the voice recording/reproducing apparatus into the standby mode after a communication process has been completed, and returns the voice recording/reproducing apparatus to said communication mode if said cover-opening detection means detects a signal indicating closing of the cover.

6. A voice recording/reproducing apparatus according to claim 5, wherein the control means inhibits execution of detection of switch input and a predetermined sequence concerning the detection during the communication mode and the standby mode.

7. A voice recording/reproducing apparatus according to claim 5, wherein the control means inhibits shift to the communication mode when the signal indicating opening of the cover is supplied from the cover-opening detection means.

8. A method of controlling a voice recording/reproducing apparatus, wherein said voice recording/reproducing apparatus includes a storage device having a voice-data region and an index-information region, and communication means for establishing communication with an external communication apparatus, said method comprising:
   controlling writing of voice data converted into digital signals and index information relating to the voice data on the voice-data region and the index information region of the storage device;
   controlling reading of the voice data stored in the voice-data region of the storage means in accordance with the index information stored in the index-information region of the storage means; and
   limiting a power consumption of the recording/reproducing apparatus by shifting the voice recording/reproducing apparatus into a standby mode after a communication mode has been interrupted if a communication operation meets a predetermined condition with respect to a process for transmitting the voice data stored in the voice-data region of the storage device to the external communication apparatus during the communication mode in which the communication means is capable of communicating with the external communication apparatus.

9. A voice recording/reproducing apparatus comprising:
   an operation portion having a plurality of switches for bringing the voice recording/reproducing apparatus to a predetermined operation state including a voice recording/reproducing mode;
   a storage device having a voice-data region and an index-information region;
   a communication portion for establishing communication with an external communication apparatus;
   a first control unit arranged to correspond to the voice recording/reproducing mode realized by the operation portion so as to control writing of voice data converted into digital signals and index information relating to the voice data on the voice-data region and the index-information region of the storage device, and to control reading of the voice data stored in the voice-data region in accordance with the index information stored in the index-information region of the storage device;
   a determining portion for determining whether or not a communication operation concerning a process for transmitting the voice data stored in the voice-data region of the storage device to the external communication apparatus satisfies a predetermined condition during a communication mode in which the communication portion is capable of communicating with the external communication apparatus; and
   a second control unit for interrupting the communication mode when the determining portion has determined that the communication operation satisfies the predetermined condition so as to limit a power source of the voice recording/reproducing apparatus to low power consumption by shifting the voice recording/reproducing apparatus into a standby mode.

10. A voice recording/reproducing apparatus according to claim 9, wherein the predetermined condition is a condition in which a predetermined time period has elapsed without any communication operation.

11. A voice recording/reproducing apparatus according to claim 9, wherein the second control unit inhibits execution of an operation of the first control unit to detect an operation of each of the plurality of switches of the operation portion and a predetermined sequence concerning the detection during the communication mode and the standby mode.

12. A voice recording/reproducing apparatus according to claim 9, wherein the second control unit inhibits shift to the communication mode when the first control unit is executing a predetermined sequence including control of writing of the voice data and the index information and control of reading of the voice data.

13. A voice recording/reproducing apparatus according to claim 9, wherein the determining portion includes a cover-opening detecting portion for detecting opening of a cover of a battery accommodating portion for accommodating a battery which is the power source of the voice recording/reproducing apparatus, wherein the predetermined condition is a condition in which a signal indicating opening of the cover has been supplied from the cover-opening detecting portion, and wherein the second control unit shifts the voice recording/reproducing apparatus into the standby mode after completing a communication process, and returns the voice recording/reproducing apparatus to said communication mode if said cover-opening detection means detects a signal indicating closing of the cover.

14. A voice recording/reproducing apparatus according to claim 13, wherein the second control unit inhibits execution of an operation of the first control unit to detect an operation of each of the plurality of switches of the operation portion and a predetermined sequence concerning the detection during the communication mode and the standby mode.

15. A voice recording/reproducing apparatus according to claim 13, wherein the second control unit inhibits shift to the communication mode when the signal indicating opening of the cover is supplied from the cover-opening detecting portion of the determining portion.

16. A method of controlling a voice recording/reproducing apparatus wherein said voice recording/reproducing apparatus includes an operation portion having a plurality of switches for realizing a predetermined operation state including a voice recording/reproducing mode, a storage device having a voice-data region and an index-information region, and a communication portion for establishing communication with an external communication apparatus, said method comprising:

when the voice recording/reproducing mode is realized by the operation portion, controlling writing of voice data converted into digital signals and index information relating to the voice data on the voice-data region and the index-information region of the storage device, and controlling reading of the voice data stored in the voice-data region in accordance with the index information stored in the index-information region of the storage device;

determining whether or not a communication operation concerning a process for transmitting the voice data stored in the voice-data region of the storage device to the external communication apparatus satisfies a predetermined condition during a communication mode in which the communication portion is capable of communicating with the external communication apparatus; and interrupting the communication mode when a determination has been made that the communication operation satisfies the predetermined condition so as to limit a power source of the voice recording/reproducing apparatus to low power consumption by shifting the voice recording/reproducing apparatus into a standby mode.

* * * * *